United States Patent
Yu-Jen et al.

(10) Patent No.: US 8,748,197 B2
(45) Date of Patent: Jun. 10, 2014

(54) REVERSE PARTIAL ETCHING SCHEME FOR MAGNETIC DEVICE APPLICATIONS

(75) Inventors: Wang Yu-Jen, San Jose, CA (US); Chin Yuan-Tung, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 280 days.

(21) Appl. No.: 13/419,507

(22) Filed: Mar. 14, 2012

(65) Prior Publication Data

US 2013/0244342 A1    Sep. 19, 2013

(51) Int. Cl.
*H01L 21/8239* (2006.01)
*H01L 21/3213* (2006.01)
*H01L 43/12* (2006.01)
*H01L 27/22* (2006.01)

(52) U.S. Cl.
CPC .............. *H01L 43/12* (2013.01); *H01L 27/222* (2013.01)
USPC .......................... 438/3; 257/421; 257/E21.665

(58) Field of Classification Search
CPC .............................. H01L 43/12; H01L 27/222
USPC ................................ 438/3; 257/E21.665, 421
See application file for complete search history.

(56) References Cited

U.S. PATENT DOCUMENTS

| | | | | |
|---|---|---|---|---|
| 6,162,649 | A * | 12/2000 | Kweon et al. ...................... | 438/3 |
| 6,524,868 | B2 * | 2/2003 | Choi et al. ......................... | 438/3 |
| 6,645,822 | B2 * | 11/2003 | Schlosser ...................... | 438/396 |
| 6,713,802 | B1 * | 3/2004 | Lee ............................... | 257/295 |
| 6,746,875 | B2 * | 6/2004 | Okazawa et al. .................. | 438/3 |
| 6,806,096 | B1 * | 10/2004 | Kim et al. .......................... | 438/3 |
| 6,815,248 | B2 * | 11/2004 | Leuschner et al. .............. | 438/59 |
| 6,884,630 | B2 * | 4/2005 | Gupta et al. ..................... | 438/3 |
| 6,939,722 | B2 * | 9/2005 | Okazawa et al. .................. | 438/3 |
| 7,001,783 | B2 * | 2/2006 | Costrini et al. ..................... | 438/3 |
| 7,112,861 | B2 * | 9/2006 | Kanakasabapathy et al. .............................. | 257/421 |
| 7,169,623 | B2 * | 1/2007 | Ditizio ............................... | 438/3 |
| 7,183,120 | B2 * | 2/2007 | Berg et al. ......................... | 438/3 |
| 7,195,927 | B2 * | 3/2007 | Sharma et al. .................... | 438/3 |
| 7,528,457 | B2 * | 5/2009 | Horng et al. .................. | 257/421 |
| 7,531,367 | B2 * | 5/2009 | Assefa et al. ...................... | 438/3 |
| 7,683,060 | B2 | 3/2010 | Zhuo et al. | |
| 8,059,374 | B2 | 11/2011 | Zhao et al. | |
| 8,081,505 | B2 | 12/2011 | Kajiyama et al. | |
| 8,148,174 | B1 * | 4/2012 | Abedifard et al. ................ | 438/3 |
| 8,278,122 | B2 * | 10/2012 | Lu et al. ............................ | 438/3 |
| 8,313,959 | B1 * | 11/2012 | Huang et al. ..................... | 438/3 |
| 8,313,960 | B1 * | 11/2012 | Abedifard et al. ................ | 438/3 |
| 8,513,749 | B2 * | 8/2013 | Chen et al. .................... | 257/421 |

(Continued)

*Primary Examiner* — Mary Wilczewski
(74) *Attorney, Agent, or Firm* — Saile Ackerman LLC; Stephen B. Ackerman; Rosemary L. S. Pike

(57) ABSTRACT

A magnetic tunnel junction (MTJ) structure is provided over a device wherein the MTJ comprises a tunnel barrier layer between a free layer and a pinned layer; and a top and bottom electrode inside the MTJ structure. A hard mask layer is formed on the top electrode. The hard mask layer, top electrode, free layer, tunnel barrier layer, and pinned layer are patterned to define the magnetic tunnel junction (MTJ) structures. A first dielectric layer is deposited over the MTJ structures and planarized to expose the top electrode. Thereafter, the top electrode and free layer are patterned. A second dielectric layer is deposited over the MTJ structures and planarized to expose the top electrode. A third dielectric layer is deposited over the MTJ structures and a metal line contact is formed through the third dielectric layer to the top electrode to complete fabrication of the magnetic device.

17 Claims, 6 Drawing Sheets

(56) References Cited

U.S. PATENT DOCUMENTS

| | | | |
|---|---|---|---|
| 8,536,063 B2* | 9/2013 | Satoh et al. | 438/735 |
| 8,569,849 B2* | 10/2013 | Huang et al. | 257/414 |
| 8,604,569 B2* | 12/2013 | Hosotani et al. | 257/421 |
| 2004/0084400 A1* | 5/2004 | Costrini et al. | 216/22 |
| 2006/0051881 A1* | 3/2006 | Ditizio | 438/3 |
| 2009/0091863 A1* | 4/2009 | Hosotani et al. | 360/324.2 |
| 2009/0130779 A1* | 5/2009 | Li et al. | 438/3 |
| 2012/0028373 A1* | 2/2012 | Belen et al. | 438/3 |
| 2013/0244342 A1* | 9/2013 | Wang et al. | 438/3 |
| 2013/0337582 A1* | 12/2013 | Satoh et al. | 438/3 |
| 2014/0024139 A1* | 1/2014 | Huang et al. | 438/3 |

* cited by examiner

REVERSE PARTIAL ETCHING SCHEME FOR MAGNETIC DEVICE APPLICATIONS

(1) TECHNICAL FIELD

This disclosure is related to Magnetic Devices, and more particularly, to methods of forming Magnetic Devices of improved quality.

(2) BACKGROUND

The present disclosure relates to the field of Magnetic Devices, and such devices include, but are not limited to, (1) various designs of Magnetic Random Access Memory (MRAM), e.g., In-plane or Out-of-plane (PMA) Spin-Torque-Transfer (STT) RAM, (2) various designs of Spin Valve read head or sensor, and (3) other Spintronic devices.

For spin torque applications, to avoid short-circuiting of magnetic tunnel junctions (MTJ) and to reduce the magneto-static coupling between the free layer (FL) and the reference layer (RL) of an MTJ, an etching stop is used in the tunnel barrier formation process. In many current MTJ devices, a SAF (synthetic antiferromagnetic) structure is implanted in the reference layer to reduce the offset field of the free layer. However, as the MTJ size is decreased down to 100 nm, it is getting harder for the SAF RL to minimize the offset field of the free layer. This limits the scalability of STT-MRAM beyond the 65 nm technology node.

U.S. Pat. No. 7,863,060 to Beleen et al, U.S. Pat. No. 8,059,374 to Zhao et al, and U.S. Pat. No. 8,081,505 to Kajiyama et al teach various methods of etching a MTJ. These methods are insufficient for devices of 100 nm and below.

SUMMARY

It is the primary objective of the present disclosure to provide an improved method for fabricating STT-RAM or related spintronic devices.

It is another objective of the present disclosure to provide an improved method for fabricating STT-RAM or related spintronic devices using an etching stop on the tunnel barrier.

It is a further objective to provide an improved method for fabricating STT-RAM or related spintronic devices wherein the method provides control of resistance uniformity, coercivity uniformity, and offset field uniformity of the MTJ devices across the whole wafer.

Yet another objective is to minimize etching damage of the reference layer.

In accordance with the objectives of the present disclosure, a method of fabricating a magnetic device is described. A magnetic tunnel junction (MTJ) structure is provided over a device wherein the MTJ comprises a tunnel barrier layer between a free layer and a pinned layer, and a top and bottom electrode inside the MTJ structure. A hard mask layer is formed on the top electrode. The hard mask layer, top electrode, free layer, tunnel barrier layer, and pinned layer are patterned to define the magnetic tunnel junction (MTJ) structures. A first dielectric layer is deposited over the MTJ structures and planarized to expose the top electrode. Thereafter, the top electrode and free layer are patterned. A second dielectric layer is deposited over the MTJ structures and planarized to expose the top electrode. A third dielectric layer is deposited over the MTJ structures and a metal line contact is formed through the third dielectric layer to the top electrode to complete fabrication of the magnetic device.

BRIEF DESCRIPTION OF THE DRAWINGS

In the accompanying drawings forming a material part of this description, there is shown.

DETAILED DESCRIPTION

Figure 1A:
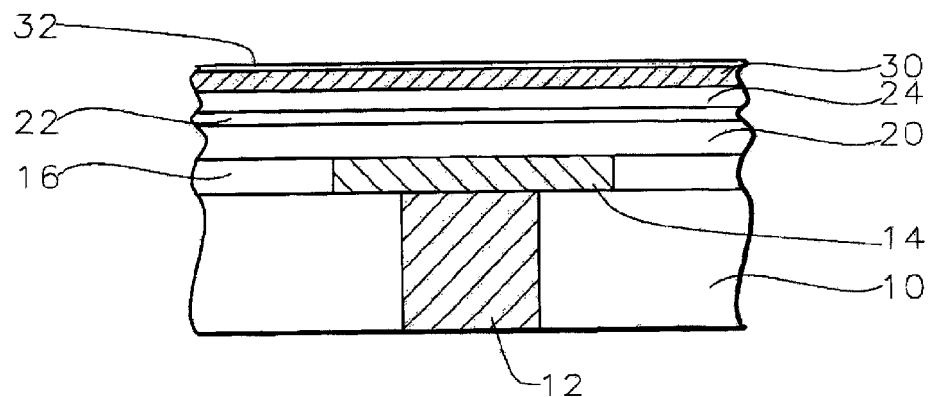
FIGS. 1A-1D are cross-sectional representations of steps in a previous fabrication process.

The present disclosure is a method of manufacturing the STT-RAM and related spintronic devices using an etching stop on the tunnel barrier. The method includes forming the MTJ structure over a metal landing pad, etching the whole MTJ structure to make the electric isolation between MTJ junctions, depositing a dielectric, and performing a chemical mechanical polishing (CMP) process to smoothen the topography. The method further includes an etching stop on the tunnel barrier (e.g.: MgO or AlO) to define the free layer (FL) area, and then forming an insulation encapsulation layer (e.g. $SiO_2$ or SiN) around the MTJ device. With the method of this disclosure, we can improve the uniformity of the free layer and reference layer dimensions, which is important for the control of the resistance uniformity, coercivity (Hc) uniformity, and offset field (Hoff) uniformity of the free layer in the MTJ device. We can also minimize damage to the reference, or pinned, layer during the etching process. The magnetic properties of the reference layer can also be controlled well due to the better dimension uniformity and less tapered sidewall angle.

First we will describe a traditional method as shown in FIG. 1. The traditional method performs the photo-etching process to define the free layer before defining the pinned layer. FIG. 1A illustrates a substrate 10 in which a bottom metal electrode 12 has been formed. A landing pad 14 is formed within a dielectric layer 16. The landing pad overlies and contacts the bottom electrode 12.

Sequentially on the landing pad 14 are formed a pinned layer 20, a tunnel barrier layer 22, and a free layer 24. A top electrode 30 and hard mask layer 32 are formed over the free layer. A reactive-ion etching (RIE) process is needed to etch the magnetic material of an MTJ device in the semiconductor industry, and a hard mask is also necessary for the MTJ etching process. Generally speaking, a metal hard mask, such as Ta, Ti, TaN, and the like, is preferred for this application Next, as shown in FIG. 1B, the hard mask, top electrode, and free layer are etched away, stopping on the tunnel barrier layer 22, to form a free layer pattern.

Figure 1B:
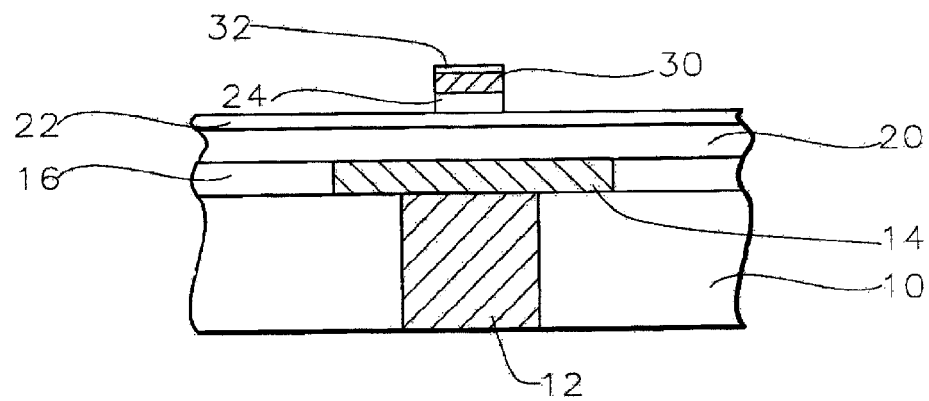
Figure 1C:
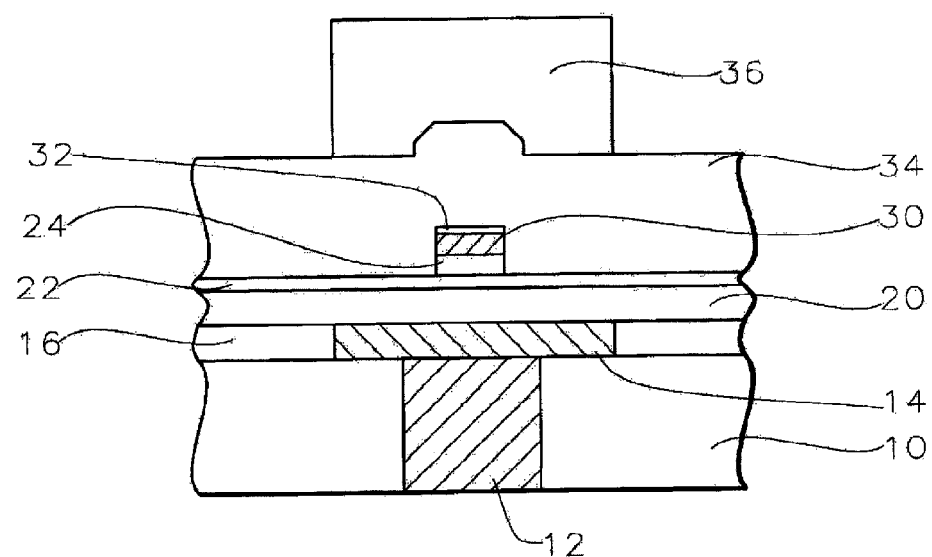

In FIG. 1C, dielectric layer 34 is deposited over the free layer pattern. A photoresist pattern 36 is placed over the dielectric layer 34 in preparation for patterning the MTJ device. This illustrates one drawback of the traditional method. The sidewall of the free layer will be exposed immediately after the etching process of defining the free layer. In this case, some interaction between the sidewall of free layer 24 and the dielectric layer 34 surrounding the recording layer, or free layer, might occur when we perform the plasma etching for defining the pinned layer. Especially when the MTJ device size is down to a sub 65 nm dimension, this kind of plasma damage or sidewall damage will become significant.

Another drawback of this traditional method is the partial removal of the hard mask 32 during the first etching step to define the free layer area, shown in FIG. 1A. In that case, we need to deposit the hard mask layer again for defining the pinned layer. However, to prevent shorting between the free layer and the pinned layer, a metal hard mask cannot be used. Instead of a metal hard mask, deposition of a dielectric layer 34 is necessary to be the hard mask material for defining the pinned layer.

Figure 1D:
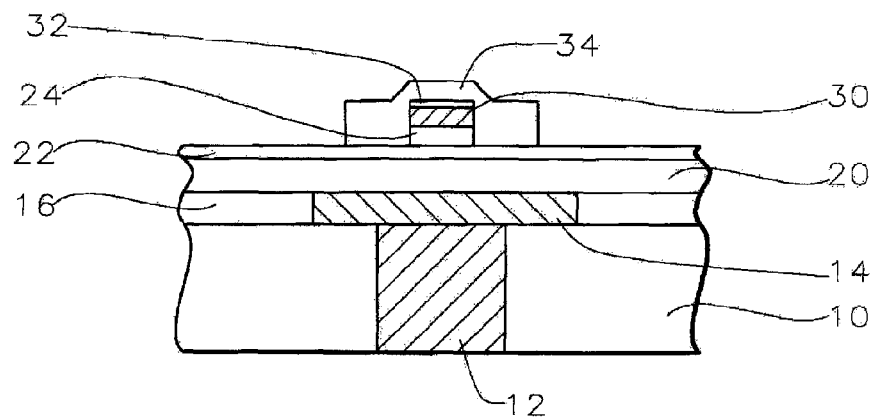
Figure 2:
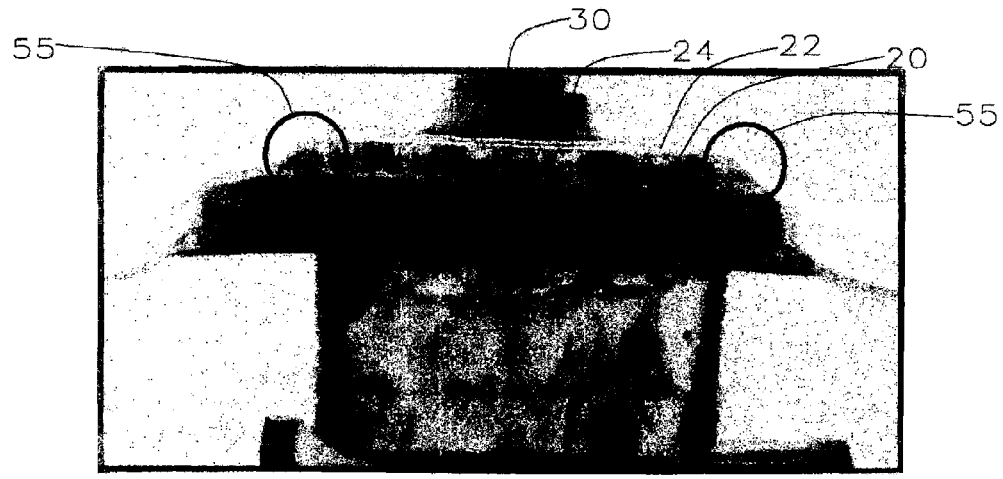
FIG. 2 is a TEM image of an MTJ device formed according to the method of FIGS. 1A-1D.

FIG. 1D shows the etching of the pinned layer using the dielectric 34 as the hard mask material to form the completed MTJ device. FIG. 2 shows a Transmission electron microscopy (TEM) image of the MTJ device. It can be seen at 55 that the taper angle of the pinned layer becomes worse after the pinned layer etching process. This is because the etching rate ratio between the magnetic material and the dielectric hard mask is not as large as the ratio between the magnetic material and the metal hard mask. This makes the dimension control (size and uniformity) of the pinned layer area become challenging. The taper angle of the pinned layer will also impact the uniformity control of Hc and Hoff for the free layer.

In the method of the present disclosure, the photo and etching process will be performed for defining the pinned layer area just after the MTJ multilayer deposition. Since the metal layer (Ta or TaN) could be used as the hard mask layer in this step, a much better CD (critical dimension) control and uniformity will be expected. After the photo/etching process of the pinned layer, a dielectric deposition and CMP process will be performed to protect the sidewall of the pinned layer. This dielectric may be silicon oxide, silicon nitride, SiCN, or any other dielectric material. The sidewall protection of the pinned layer will prevent etching damage by the subsequent etching process for defining the free layer. This will, in turn, improve the uniformity control of Hc and Hoff of the free layer. Then, a photo/etch process will be performed to define the free layer area. It is important to note that both the etch process for defining the pinned layer area and the etch process for defining the free layer area could utilize the same metal hard mask layer without an extra process for depositing another hard mask layer.

Figure 3:
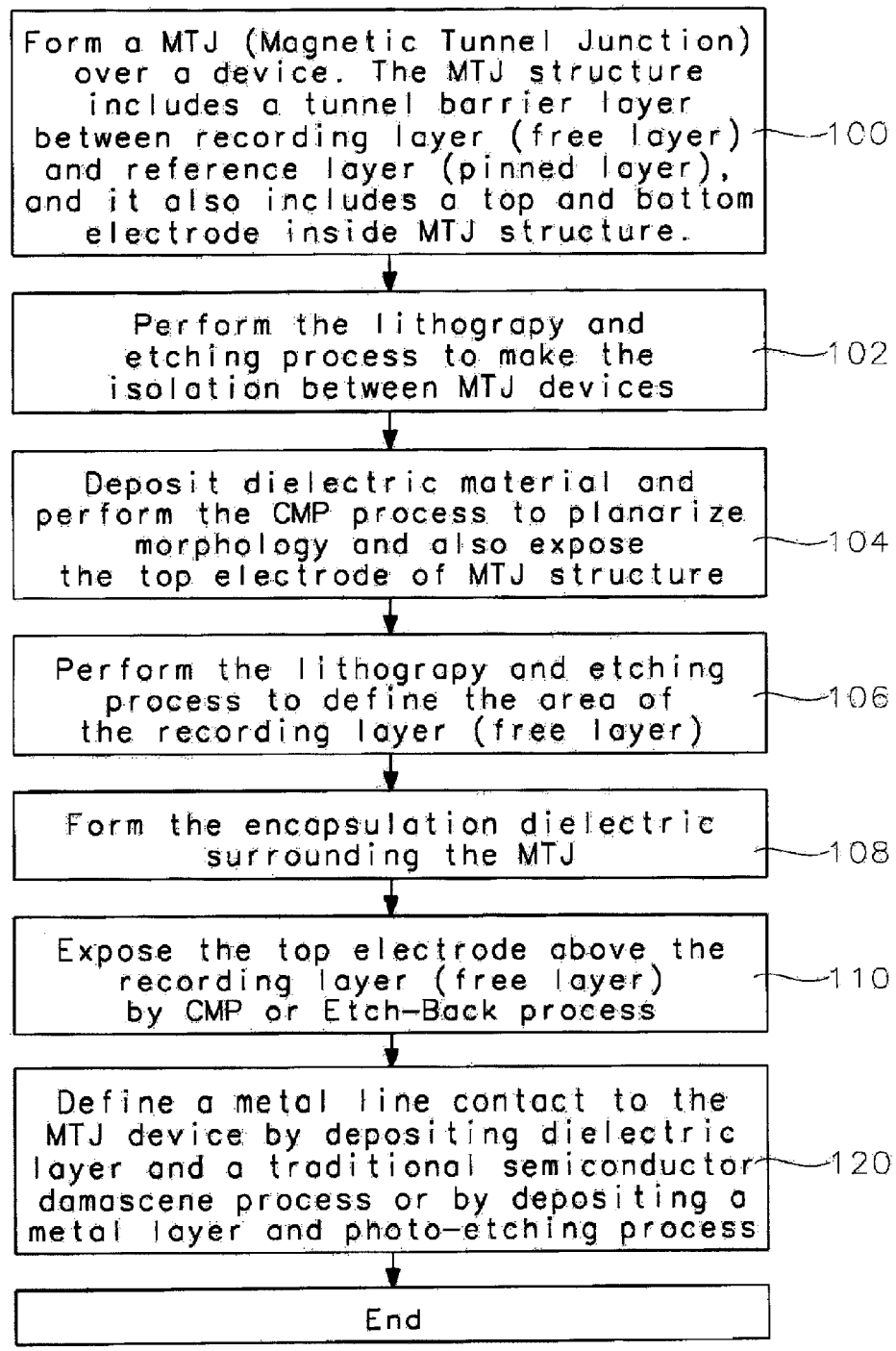
FIG. 3 is a flow chart detailing a preferred embodiment of the present disclosure.

Referring now to FIGS. 3 and 4, the method of the present disclosure will be described in detail. FIG. 3 is a flowchart of the process of the present disclosure. The process begins with step 100, illustrated in cross-section in FIG. 4A. This first step is the same as in the traditional method. Bottom metal electrode 12 is formed in substrate 10. A landing pad 14 is formed within a dielectric layer 16. The landing pad overlies and contacts the bottom electrode 12. Sequentially on the landing pad 14 are formed a pinned layer 20, a tunnel barrier layer 22, and a free layer 24. The pinned layer may be a single layer or a multilayer SAF reference layer. The tunnel barrier layer may be MgO or AlO, or another tunnel barrier material.

A top electrode 30 and hard mask layer 32 are formed over the free layer. The metal hard mask may be Ta, Ti, TaN, or other hybrid materials. The magnetization direction of the free layer and the pinned layer could be in-plane or perpendicular-to-plane. The dimension of the free layer will determine the writing current since the dimension of the free layer is proportional to the writing current. That is why we prefer to have the free layer over the pinned layer and that is why we prefer the free layer to have a smaller dimension that that of the pinned layer.

Figure 4A:
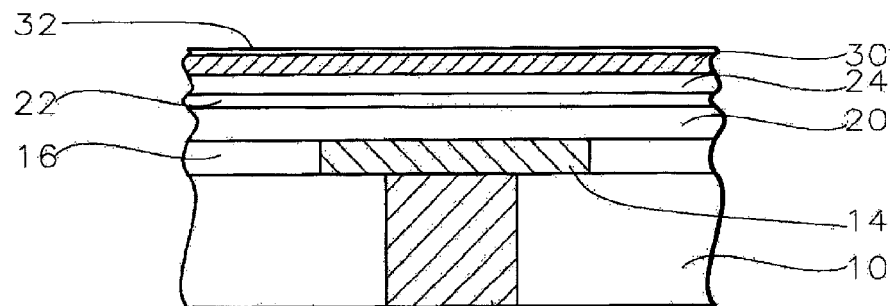
FIGS. 4A-4G are cross-sectional representations of steps in a preferred embodiment of the present disclosure.
Figure 4B:
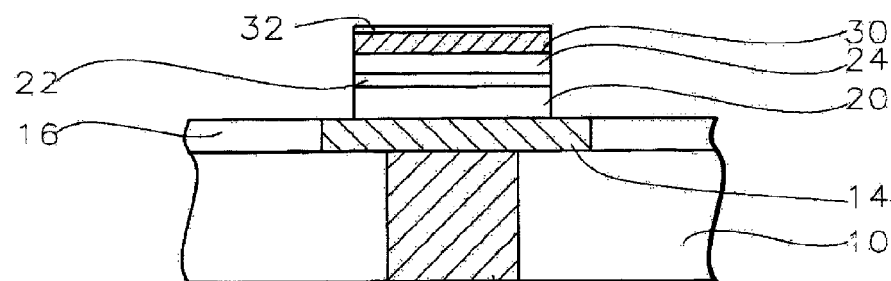
Figure 4C:
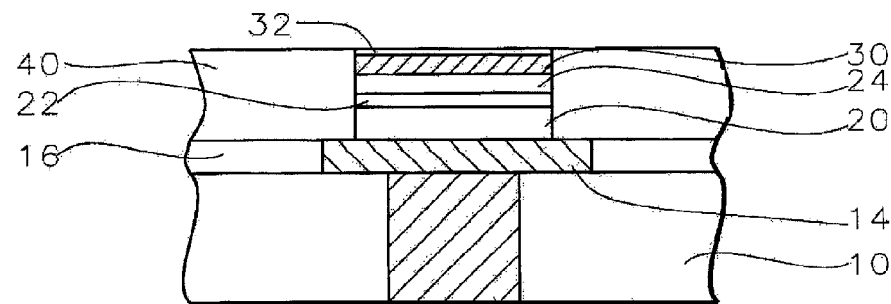

In step 102, illustrated in FIG. 4B, a lithography and etching process is performed to make the isolation between the MTJ devices. Next, as illustrated in FIG. 4C and described in step 104, a dielectric layer 40 is deposited and polished using CMP, for example, to planarize the morphology of the device structure and to expose the hard mask layer 32 on the top electrode 30 of the MTJ structures. The dielectric layer could be SiO, SiN, SiCN, or SiON, for example.

Figure 4D:
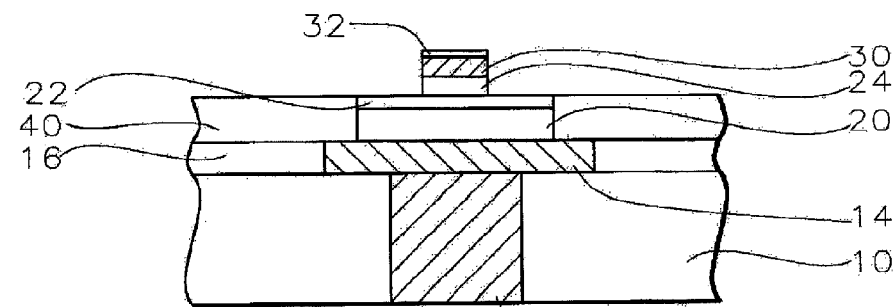

Now, in step 106 and as shown in FIG. 4D, a second lithography and etching process is performed to define the area of the recording layer, or free layer. As mentioned above, it is preferred that the free layer have a smaller area than the pinned layer.

Figure 4E:
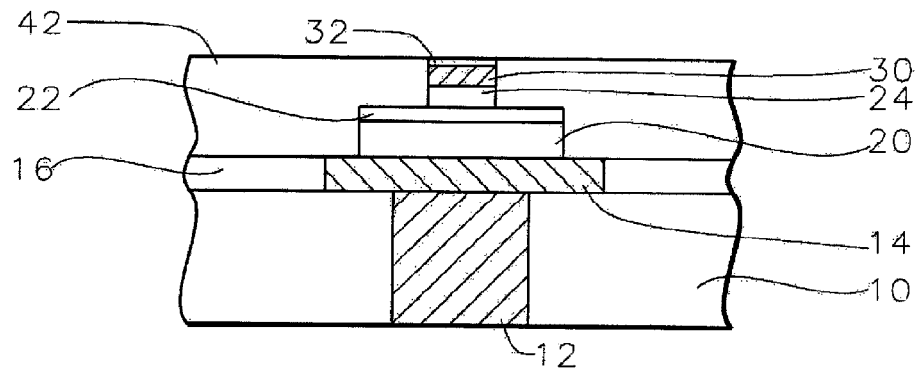
Figure 4F:
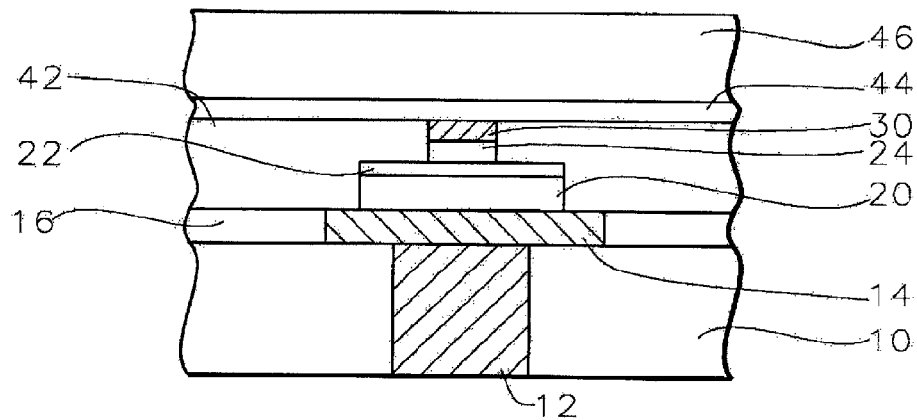
Figure 4G:
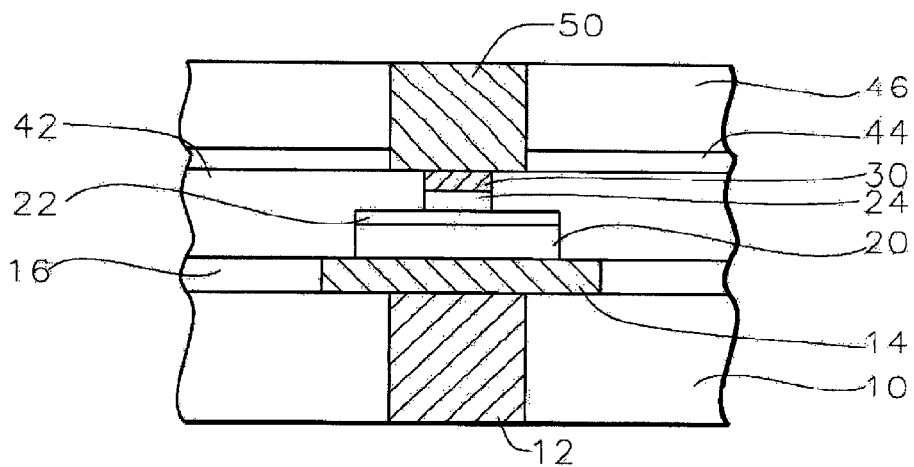

After defining the free layer area, a dielectric layer 42 is deposited. This could be SiO, SiN, SiCN, or SiON, for example. Next, a CMP process planarizes the dielectric layer and exposes the top electrode 30 as shown in steps 108 and 110 and in FIG. 4E. FIG. 4E shows that the hard mask 32 is still in place on the top electrode 30. This is one alternative. In FIGS. 4F and 4G, the alternative in which the hard mask 32 is removed is shown. Either alternative is possible.

Then in step 112, a semiconductor standard damascene process will be performed to form a metal line contact to the MTJ device. FIG. 4F shows the deposition of etch stop layer 44 and dielectric layer 46. Metal line contact 50 is shown in FIG. 4G contacting the top electrode 30 or hard mask layer 32.

Figure 5:
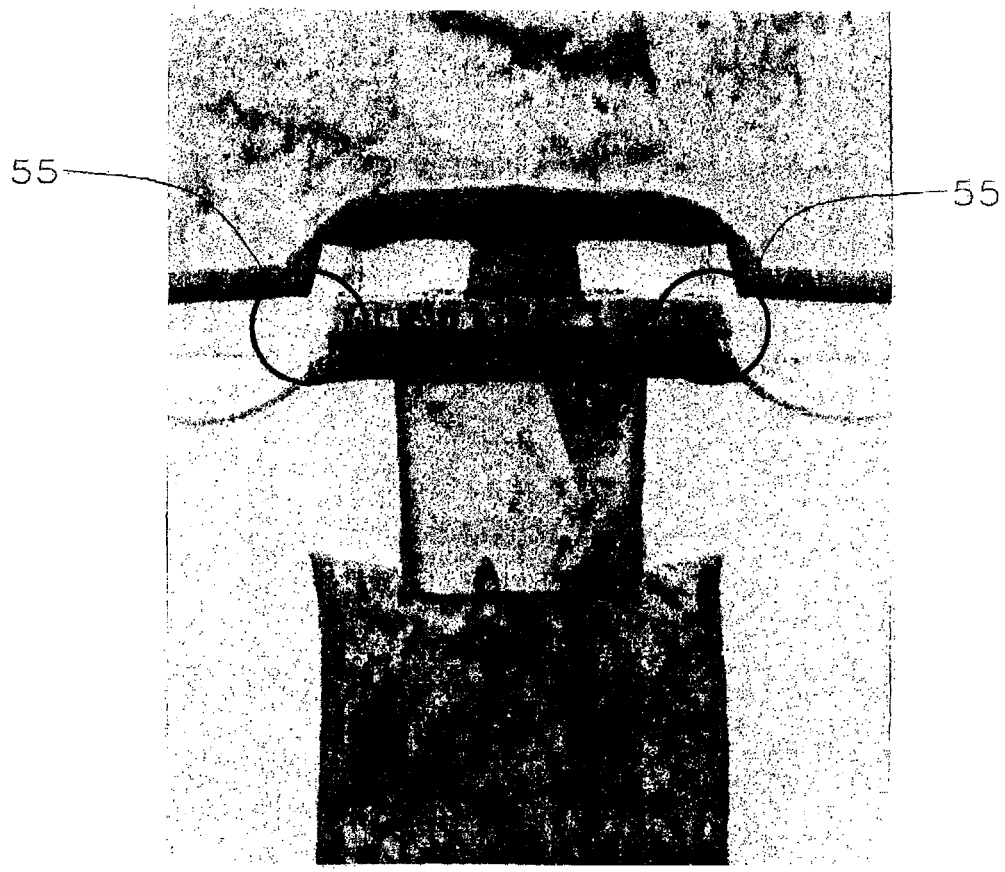
FIG. 5 is a TEM image of an MTJ device formed according to the method of FIGS. 4A-4G.

FIG. 5 shows a Transmission electron microscopy (TEM) image of the MTJ device fabricated according to the present disclosure. It can be seen at 55 that the taper angle of the pinned layer is mush less than in the traditional method shown in FIG. 2. This shows that the tapered sidewall of the reference layer is well protected, resulting in better dimension control (size and uniformity) of the pinned layer area, and also resulting in better uniformity control of Hc and Hoff for the free layer. For example, Hoff may be about 500 Oe.

The advantages of the present disclosure include improved uniformity of the Hc and Hoff of the free layer by improving the size and sidewall control (tapered angle and less side wall damage) of the pinned layer. Since the etching process of the free layer is performed after defining the pinned layer in this disclosure, less plasma damage to free layer will also be expected. The process of this disclosure results in a much better yield than the traditional method. This disclosure will be very important, particularly for STT-RAM or other spintronic device fabrication processes.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a magnetic device comprising:
providing a magnetic tunnel junction (MTJ) structure over a device wherein said MTJ comprises a tunnel barrier layer between a free layer and a pinned layer, a top electrode over said free layer, and a bottom electrode under said pinned layer;
forming a hard mask layer on said top electrode;
patterning said hard mask layer, said top electrode, said free layer, said tunnel barrier layer, and said pinned layer to define said magnetic tunnel junction (MTJ) structures;
depositing a first dielectric layer over said MTJ structures and planarizing said first dielectric layer to expose said top electrode;
thereafter patterning said top electrode and said free layer;
thereafter depositing a second dielectric layer over said MTJ structures and planarizing said second dielectric layer to expose said top electrode;
thereafter depositing a third dielectric layer over said MTJ structures; and forming a metal line contact through said third dielectric layer to said top electrode to complete fabrication of said magnetic device.

2. The method according to claim 1 wherein said magnetic device comprises magnetic random access memory, in-plane or out-of-plane spin-torque-transfer random access memory, spin valve read head or sensor, or other spintronic device.

3. The method according to claim 1, wherein said pinned layer comprises a single layer.

4. The method according to claim 1, wherein said pinned layer comprises multiple synthetic antiferromagnetic layers.

5. The method according to claim 1, wherein said hard mask layer comprises Ta, Ti, TaN, or other hybrid hard mask materials.

6. The method according to claim 1, wherein said tunnel barrier layer comprises MgO or AlO or another tunneling barrier material.

7. The method according to claim 1, wherein said first, second, and third dielectric layer comprise $SiO_2$, SiN, SiCN, or SiON.

8. The method according to claim 1, wherein said magnetic device has a Hoff of about 500 Oe.

9. A method of fabricating a magnetic device comprising:
providing a bottom electrode in a substrate;
forming a landing pad overlying and contacting said bottom electrode;
sequentially forming on said landing pad a pinned layer, a tunnel barrier layer, and a free layer;
forming a top electrode layer on said free layer;
forming a hard mask layer on said top electrode layer;
patterning said hard mask layer, said top electrode layer, said free layer, said tunnel barrier layer, and said pinned layer to define magnetic tunnel junction (MTJ) structures;
depositing a first dielectric layer over said MTJ structures and planarizing said first dielectric layer to expose said top electrode layer;
thereafter patterning said top electrode layer and said free layer;
thereafter depositing a second dielectric layer over said MTJ structures and planarizing said second dielectric layer to expose said top electrode layer;
depositing a third dielectric layer over said MTJ structures; and
forming a metal line contact through said third dielectric layer to said top electrode to complete fabrication of said magnetic device.

10. The method according to claim 9, wherein said magnetic device comprises magnetic random access memory, in-plane or out-of-plane spin-torque-transfer random access memory, spin value read head or sensor, or other spintronic device.

11. The method according to claim 9, wherein said pinned layer comprises a single layer.

12. The method according to claim 9, wherein said pinned layer comprises multiple synthetic antiferromagnetic layers.

13. The method according to claim 9, wherein said hard mask layer comprises Ta, Ti, TaN, or other hybrid hard mask materials.

14. The method according to claim 9, wherein said tunnel barrier layer comprises MgO or AlO or other tunnel barrier materials.

15. The method according to claim 9, wherein said first, second, and third dielectric layers comprise $SiO_2$, SiN, SiCN, or SiON.

16. The method according to claim 9, wherein said hard mask layer remains on said top electrode and wherein said metal line contacts said top electrode through said hard mask layer.

17. The method according to claim 9, wherein said magnetic device has a Hoff of about 500 Oe.

* * * * *

UNITED STATES PATENT AND TRADEMARK OFFICE
CERTIFICATE OF CORRECTION

PATENT NO. : 8,748,197 B2  
APPLICATION NO. : 13/419507  
DATED : June 10, 2014  
INVENTOR(S) : Yu-Jen Wang and Yuan-Tung Chin Page 1 of 1

It is certified that error appears in the above-identified patent and that said Letters Patent is hereby corrected as shown below:

Title Page, item (12) "Yu-Jen et al." should read -- Wang et al. --.

Title Page, in the Inventors item (75), delete first Inventor "Wang Yu-Jen, San Jose, CA (US)" and replace with -- Yu-Jen Wang, San Jose, CA (US) --.

Title Page, in the Inventors item (75), delete second Inventor "Chin Yuan-Tung, Fremont, CA (US)" and replace with -- Yuan-Tung Chin, Fremont, CA (US) --.

Signed and Sealed this  
Ninth Day of September, 2014

Michelle K. Lee  
*Deputy Director of the United States Patent and Trademark Office*